United States Patent [19]
Joyner et al.

[11] Patent Number: 6,114,741
[45] Date of Patent: Sep. 5, 2000

[54] TRENCH ISOLATION OF A CMOS STRUCTURE

[75] Inventors: Keith A. Joyner, Richardson; Lee M. Loewenstein, Plano, both of Tex.

[73] Assignee: Texas Instruments Incorporated, Dallas, Tex.

[21] Appl. No.: 08/987,226

[22] Filed: Dec. 9, 1997

Related U.S. Application Data

[60] Provisional application No. 60/032,734, Dec. 13, 1996.

[51] Int. Cl.⁷ .................................................. H01L 21/20
[52] U.S. Cl. ...................... 257/506; 257/369; 257/374; 257/397; 257/403; 257/407; 257/412; 257/66
[58] Field of Search .................................. 257/374, 369, 257/397, 403, 506, 407, 412, 616

[56] References Cited

U.S. PATENT DOCUMENTS

| | | | |
|---|---|---|---|
| 4,578,128 | 3/1986 | Mundt et al. | 148/149 |
| 5,436,189 | 7/1995 | Beasom | 148/DIG. 50 |
| 5,661,311 | 8/1997 | Takamura et al. | 257/347 |
| 5,721,174 | 2/1998 | Peidous | 438/445 |
| 5,861,104 | 1/1999 | Omid-Zohoor | 438/426 |
| 5,952,701 | 9/1999 | Bulucea et al. | 257/407 |

*Primary Examiner*—Fetsum Abraham
*Attorney, Agent, or Firm*—Jacqueline J. Garner; Wade James Brady; Richard L. Donaldson

[57] ABSTRACT

An isolation structure is provided that includes a substrate (10), a refill material such as a refill oxide (22), a gate dielectric such as a gate oxide layer (24), and a gate conductor layer such a polysilicon gate layer (26). The substrate (10) has an active region (12), an active region (14), and a trench region provided between the active region (12) and the active region (14). The active region (14) includes a top corner (32) that is provided where an upper surface of the active region (14) and the trench wall of the trench region that is adjacent to the active region (14) meet. The refill oxide (22) is positioned within the trench region and extends to cover at least a portion of the top corner. The gate oxide layer (24) is provided on the upper surface of the active region (14). The polysilicon gate layer (26) is provided on an upper surface of the gate oxide layer (24).

23 Claims, 2 Drawing Sheets

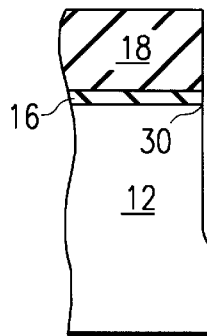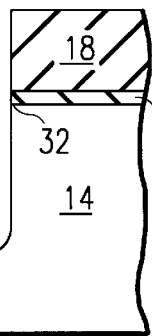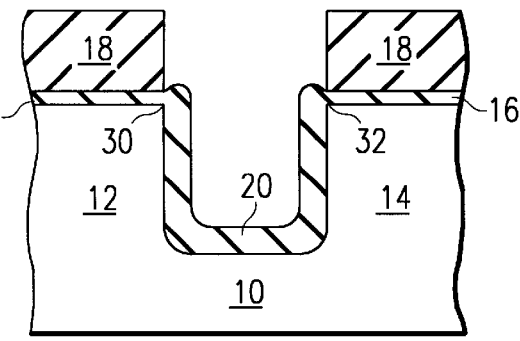
FIG. 1A          FIG. 1B
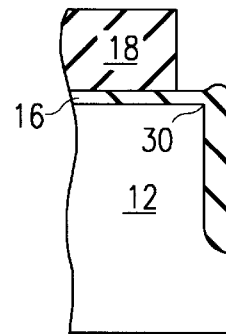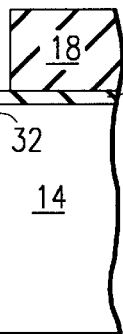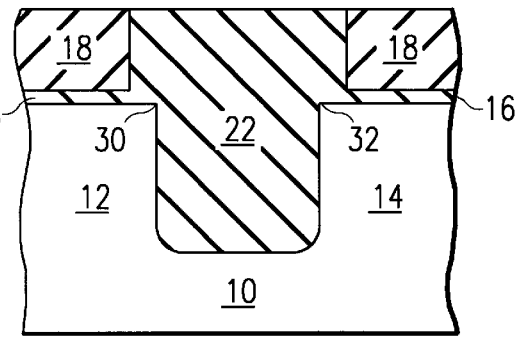
FIG. 1C          FIG. 1D
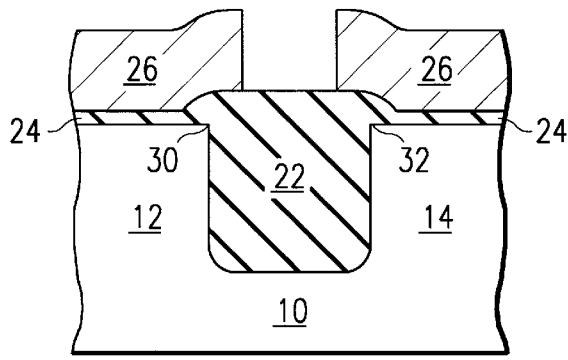
FIG. 1E

TRENCH ISOLATION OF A CMOS STRUCTURE

This application claims priority under 35 USC § 119(e)(1) of provisional application No. 60/032,734, filed Dec. 13, 1996.

TECHNICAL FIELD OF THE INVENTION

This invention relates generally to the field of semiconductor structures and fabrication techniques and more particularly to an isolation structure and method for forming the same.

BACKGROUND OF THE INVENTION

The isolation of semiconductor devices fabricated on a wafer or substrate has traditionally been performed using local oxidation of substrate ("LOCOS") isolation techniques in both bulk silicon substrate applications and silicon-on-insulator ("SOI") substrate applications. More recently, device isolation is being performed using trench isolation such as shallow trench isolation in bulk silicon substrate applications and mesa isolation in SOI substrate applications. Trench isolation provides advantages in both bulk substrate applications and SOI substrate applications. Trench isolation appears to provide even greater advantages in SOI substrate applications due to the ability to achieve isolation with a relatively shallow trench.

Although trench isolation techniques provide significant advantages, along with these advantages come certain problems and disadvantages. Specifically, when attempting to isolate an area, such as a gate junction or channel in a field-effect transistor or metal-oxide semiconductor field-effect transistor ("MOSFET"), from other devices or regions using trench isolation technology, the threshold voltage ("$V_t$") is lowered due to the presence of a parasitic transistor at the edge or corner where a trench wall meets the edge of the transistor. Furthermore, the gate oxide integrity ("GOI") is often degraded. These problems, present in both bulk silicon substrate applications and SOI substrate applications, are caused by the compressive thinning of the gate oxide and the two-dimensional field-effects at the top corner or edge where the trench wall meets the edge of the transistor. The lower threshold voltage $V_t$ of the parasitic transistor is caused by the sharp corner or edge which allows leakage currents to flow before the threshold voltage $V_t$ of the main transistor is reached. The sharp corner or edge has a relatively small radius of curvature which decreases the threshold voltage $V_t$ of the parasitic transistor. The GOI is compromised because of the compressive thinning of the gate oxide that forms around the top corner or edge where the trench wall meets the edge of the transistor or MOSFET. This thinning region has a lower breakdown voltage which decreases overall device reliability.

The presence of the parasitic transistor with the low threshold voltage $V_t$ produces excessive or higher off-state leakage currents which substantially increases overall power consumption. The off-state leakage currents also result in excess heat generation and cause problems related to the dissipation of this excess heat. GOI degradation impairs and reduces overall system or chip reliability.

SUMMARY OF THE INVENTION

From the foregoing it may be appreciated that a need has arisen for an isolation structure and method for forming the same that eliminate or reduce the problems and disadvantages described above. In accordance with the present invention, an isolation structure and method are provided that prevent the formation of a parasitic transistor with a threshold voltage $V_t$ that is less than the threshold voltage $V_t$ of a main transistor device. The present invention reduces or eliminates off-state leakage currents and increases the GOI to improve overall system reliability in the fabrication of MOSFETs, BiCMOS circuits, isolated gate bipolar transistors, and virtually any device having a sharp corner or edge where an active region meets the trench wall of a trench region. The present invention may be used when shallow trench isolation techniques are used in bulk silicon substrates and when mesa isolation techniques are used in SOI substrates.

According to an embodiment of the present invention, an isolation structure is provided that includes a substrate, a refill material, a gate dielectric layer, and a gate conductor layer. The substrate has a first active region, a second active region, and a trench region having trench walls and which is positioned between the first active region and the second active region. The first active region has a top corner or edge that is provided where an upper surface of the first active region meets with the trench wall of the trench region that is adjacent to the first active region. The refill material is positioned within the trench region and extends to cover at least a portion of the top corner. The gate dielectric layer is provided on the upper surface of the first active region, while the gate conductor layer is provided on an upper surface of the gate dielectric layer.

The present invention provides various technical advantages. A technical advantage of the present invention includes the reduction or elimination of off-state leakage currents. Another technical advantage of the present invention includes decreased heat dissipation and power consumption. Still another technical advantage of the present invention includes the prevention of the formation of a parasitic transistor with a threshold voltage $V_t$ that is less than the threshold voltage $V_t$ of a main transistor device such as a MOSFET. Yet another technical advantage includes increased gate oxide integrity which improves overall system and chip reliability. Other technical advantages are readily apparent to one skilled in the art from the following FIGUREs, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts or similar areas, in which:

FIGS. 1A through 1E are a series of schematic cross-sectional diagrams illustrating one embodiment of an isolation structure and method for forming the same.

DETAILED DESCRIPTION OF THE INVENTION

Figure 2:
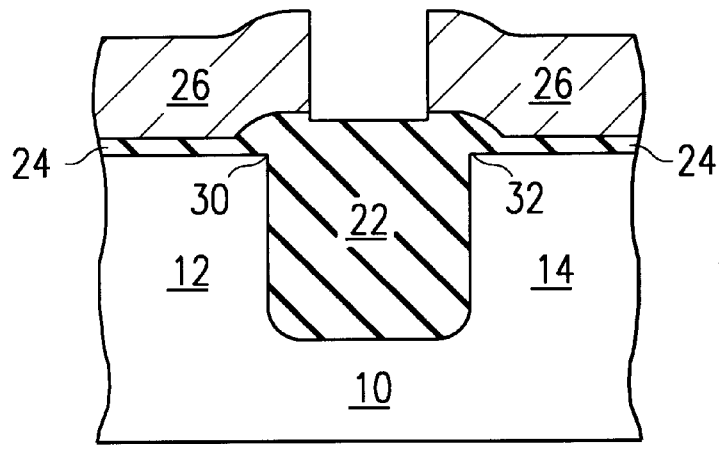
FIG. 2 is a cross-sectional diagram of an isolation structure having rounded corners according to an alternative embodiment of the invention.

FIGS. 1A through 1E are a series of schematic cross-sectional diagrams illustrating one embodiment of the fabrication of an isolation structure according to the present invention. Referring to FIG. 1A, a substrate 10 is provided that includes an active region 12 and an active region 14. Substrate 10 may be provided as a silicon bulk substrate wafer made of single-crystalline silicon or as an SOI substrate. A trench region is provided within substrate 10 and is positioned between active region 12 and active region 14. The trench region serves to isolate any microelectronic devices that may be fabricated using active region 12 and active region 14. For example, a MOSFET may be fabricated using either active region 14 or active region 12.

The trench region includes sidewalls which are positioned to define active region 12 and active region 14. In the one embodiment of the present invention illustrated in FIG. 1A, the trench walls are substantially vertical and parallel to one another. However, it should be understood that the present invention also encompasses the formation a trench region with trench walls that are not substantially vertical but are angled and which may or may not be parallel to one another.

A pad oxide layer 16 is shown positioned on the upper surface of substrate 10. Pad oxide layer 16 is provided above active region 12 and active region 14 and serves as a structural barrier between a pad nitride layer 18 and substrate 10. Pad oxide layer 16 prevents pad nitride layer 18 from damaging substrate 10 when pad nitride layer 18 expands during later steps that involve high temperatures. Pad nitride layer 18 is positioned on the upper surface of the pad oxide layer 16. Pad nitride layer 18 serves as a diffusion barrier to the portions of substrate 10 that pad nitride layer 18 covers. Pad nitride layer 18 may be constructed from any of a variety of materials that provide a harder surface as compared to the oxide of pad oxide layer 16. Similarly, pad oxide layer 16 may be implemented using any suitable pad dielectric layer.

The structure shown in FIG. 1A may be fabricated by growing or depositing pad oxide layer 16 on substrate 10. Pad oxide layer 16 will preferably be grown on the upper surface of substrate 10 but may be formed using conventional deposition techniques. Pad nitride layer 18 will generally be formed using conventional deposition techniques for forming nitride layers.

After pad nitride layer 18 and pad oxide layer 16 are formed, the trench region between active region 12 and active region 14 is formed using conventional etching techniques. The depth of the trench region may be virtually any depth to produce isolation between active region 12 and active region 14. However, shallow trench isolation ("STI") techniques will generally result in a trench region with a shallower depth. For example, the trench region may be provided at a depth of around 0.5 microns or less. It should also be noted that if substrate 10 is a SOI substrate and active region 12 and active region 14 are mesas, the depth of the trench region will generally, although not necessarily, extend to the buried oxide layer present within substrate 10. The buried oxide layer is not shown in the FIGUREs.

Active region 12 and active region 14 may be used to fabricate any of a variety of active devices or passive devices. The trench region also defines an isolation region which isolates any devices that are fabricated using active region 12 and active region 14. However, active region 12 and active region 14 will generally include a field-effect transistor device such as a MOSFET. A MOSFET includes a gate junction that includes a gate conductor layer fabricated on the surface of a gate dielectric layer such as a gate oxide layer. The one embodiment of the present invention illustrated in FIGS. 1A through 1E illustrates the formation of the junction where the trench region, gate conductor layer, and gate dielectric layer are in close proximity. Specifically, the gate of a MOSFET may be formed within active region 14 or active region 12 and the junction where the trench region, gate conductor layer, and gate dielectric layer are in close proximity is illustrated. The area of particular interest to the present invention is the top corner or edge where the trench walls of the trench region meet active region 12 and active region 14. For example, a top corner 30 and a top corner 32 are shown in FIGS. 1A through 1E. Alternatively, top corners 30 and 32 may be rounded as shown in FIG. 2.

Referring next to FIG. 1B, a structure is shown that is identical to the structure in FIG. 1A except that a sidewall oxide 20 has been grown on the exposed surfaces of the trench region. Sidewall oxide 20 will preferably be grown and may also be provided using conventional deposition techniques. Sidewall oxide 20 provides an interface for a refill oxide 22 that will be provided in a later step. Sidewall oxide 20 provides an interface that minimizes or reduces leakage currents that may be generated in the absence of sidewall oxide 20 and interfaces with pad oxide 16 to cover top corner 30 and top corner 32.

Referring next to FIG. 1C, a portion of pad nitride layer 18 is removed so that pad nitride layer 18 no longer is positioned completely above top corner 30 and top corner 32. It should be noted that the process or step of forming sidewall oxide 20 may be performed after the portions of pad nitride layer 18 are removed as illustrated in FIG. 1C. Alternatively, the process or step of forming sidewall oxide 20 may be eliminated entirely.

Referring now to FIG. 1D, a refill oxide 22 is deposited within the trench region using any known or conventional deposition technique such as chemical vapor deposition. Although refill oxide 22 is provided in the one embodiment of the present invention illustrated in the FIGUREs, it should be understood that refill oxide 22 may be implemented using almost any other material such as a dielectric, silicon dioxide, or an intrinsic semiconductor material such as polysilicon or lightly doped polysilicon. Refill oxide 22 may be virtually any material except a conductive material that would interfere with the operation of the devices to be fabricated using active region 12 or active region 14. As shown, refill oxide 22 also occupies the position previously occupied by the portions of pad nitride layer 18 that were removed in a prior step. Refill oxide 22 will normally be deposited in a manner to ensure that the trench region is filled and to ensure that top corner 30 and top corner 32 are covered as shown in FIG. 1D. However, it should be understood that the present invention includes any method of depositing refill oxide 22 that results in the filling of the trench region and the covering of top corner 30 and top corner 32, either partially or entirely. As mentioned previously, sidewall oxide 20 serves as an interface between the trench region and refill oxide 22 and is not delineated in FIG. 1D. Sidewall oxide 20 will generally be provided as the same material as refill oxide 22.

Next, refill oxide 22, along with the upper portions of pad nitride layer 18 are planarized. The planarization process results in a somewhat polished and level upper surface as shown in FIG. 1D. The planarization process removes any oxide that may have been deposited on the upper surface of pad nitride layer 18. The planarization process may be performed using any conventional planarization process such as chemical mechanical planarization.

Referring finally to FIG. 1E, pad nitride layer 18 is removed using any conventional removal technique or pattern and etch technique. For example, the portions of pad nitride layer 18 may be removed using any conventional etching technique such as a plasma etch or a wet etch. Generally, the etching will be an isotropic etch which means that the etching will proceed in all directions at the same rate. However, it should be understood that an anisotropic etch may also be performed and is, by definition, an etch that does not proceed in all directions at the same rate. Pad nitride layer 18 is removed from the upper surface of active region 12 and active region 14. After the removal of pad nitride layer 18, refill oxide 22 remains within the trench region and extends to cover all or a portion of top corner 30 and top corner 32. Pad oxide layer 16 may also be removed during a separate etching process which will generally be performed isotopically.

Figure 3:
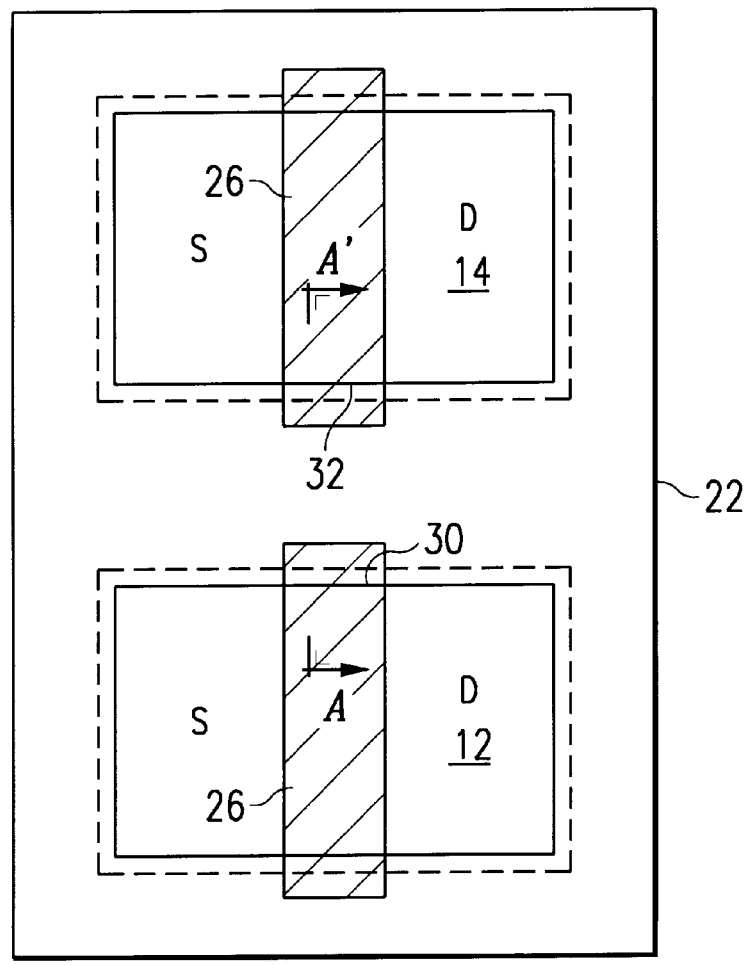
FIG. 3 is a top view of the isolation structure of FIG. 1E.

Next, a gate oxide layer 24 is grown or deposited using known or conventional techniques. Although gate oxide layer 24 is provided as an oxide in the one embodiment of the present invention illustrated in the FIGUREs, it should be understood that gate oxide layer 24 may be implemented as a gate dielectric layer. Gate oxide layer 24 may serve as the gate oxide layer of a first MOSFET that may be fabricated using active region 14 and a second MOSFET using active region 12. In such a case, a source region may be provided within an area of active region 14 and active region 12 that extends out from FIG. 1E, while a drain region is formed within an area of active region 14 and active region 12 that extends into FIG. 1E. Thus, the source region may extend out from the front side of active region 14 and active region 12, while the drain region may extend from the backside of active region 14 and active region 12 as illustrated in FIG. 1E. Such source S and drain D regions are shown in the top view diagram of FIG. 3.

In the event that a first MOSFET is fabricated using active region 14 and a second MOSFET is fabricated using active region 12, the areas of active region 14 and active region 12 that reside under gate oxide layer 24 serve as the channel of their corresponding MOSFET. In such a case, this channel area may be doped, using ion implantation techniques, to establish a desired threshold voltage $V_t$ of the main MOSFET. The establishment of the threshold voltage $V_t$ is generally performed after removing pad nitride layer 18 but before removing pad oxide layer 16.

After forming gate oxide layer 24, a polysilicon gate layer 26 is formed on the upper surface of a gate oxide layer 24 and the upper surface of a portion of refill oxide 22. Polysilicon gate layer 26 serves as a gate conductor layer which may serve as the gate junction of a field-effect transistor such as a MOSFET. Polysilicon gate layer 26 may be formed using known or conventional deposition techniques. Polysilicon gate layer 26 will generally be doped with a desired n-type or p-type dopant to convert the polysilicon material into a conductor of the desired type.

The portion of refill oxide 22 that covers all or a portion of top corner 30 and top corner 32 prevents the formation of a parasitic transistor with a threshold voltage $V_t$ that is less than the threshold voltage $V_t$ of the main transistor. Also, the fact that this portion of refill oxide 22 is thicker than gate oxide layer 24 prevents the gate oxide integrity problems that are present in the prior art when compressive stresses cause thinning in gate oxide region 24. This increases the breakdown voltage of a device, such as a field-effect transistor device, that may be fabricated on active region 14 and active region 12, and hence, increases overall device and system reliability. Although the isolation structure of the present invention has been described generally with respect to the fabrication of a MOSFET, it should be understood that the present invention is not limited to only applications involving MOSFETs. The isolation structure of the present invention may be used in the fabrication of any device that suffers from the disadvantages and problems discussed above. For example, such devices as BiCMOS devices and isolated gate bipolar transistor devices may incorporate the isolation structure of the present invention.

Thus, it is apparent there has been provided, in accordance with the present invention, an isolation structure and method for forming the same that satisfy the advantages set forth above. The present invention prevents the formation of a parasitic transistor with a threshold. voltage $V_t$ that is less than the threshold voltage $V_t$ of a corresponding main transistor such as a MOSFET. Although the isolation structure and method of the present invention may be applicable to any number of different devices, the present invention is especially applicable to the formation of MOSFET's using trench isolation. The present invention also increases overall device and system reliability by increasing gate oxide integrity by ensuring that gate oxide layer 24 does not contain unacceptably thin portions which lowers the breakdown voltage. Although the preferred embodiment has been described in detail, it should be understood that various changes, substitutions, and alterations can be made herein without departing from the scope of the present invention. For example, although the structure of the present invention has been illustrated and described using conventional semiconductor fabrication techniques, other techniques, whether currently known or not, could potentially be used to fabricate the isolation structure of the present invention. Also, some of the steps described and illustrated in the preferred embodiment as discrete or separate steps may be combined into one step without departing from the scope of the present invention. Other examples of changes, substitutions, and alterations are readily ascertainable by one skilled in the art and could be made without departing from the spirit and scope of the present invention as defined by the following claims.

What is claimed is:

1. An isolation structure comprising:
    a substrate having a first active region, a second active region, and a trench region having trench walls provided between the first active region and the second active region, the first active region having a top corner provided where an upper surface and the trench wall of the trench region adjacent to the first active region meet;
    a refill material provided within the trench region and extending to cover a portion of the top corner;
    a gate dielectric layer provided on the upper surface of the first active region; and
    a gate conductor layer provided on an upper surface of the gate dielectric layer, wherein the gate conductor layer is separated from the top corner by the refill material.

2. The structure of claim 1, wherein the refill material covers the top corner.

3. The structure of claim 1, wherein the gate conductor layer is a polysilicon gate layer.

4. The structure of claim 1, wherein the top corner is a rounded corner.

5. The structure of claim 1, wherein the substrate is a silicon-on-insulator substrate.

6. The structure of claim 1, wherein the substrate is a silicon bulk substrate.

7. The structure of claim 1, wherein the trench region is about 0.5 micrometers or less in depth.

8. The structure of claim 1, wherein the refill material is deposited anisotropically.

9. The structure of claim 1, wherein the refill material is an oxide.

10. The structure of claim 1, wherein the refill material is a dielectric material.

11. The structure of claim 1, wherein the refill material is an intrinsic semiconductor.

12. The structure of claim 1, wherein the trench region is a shallow trench isolation region.

13. The structure of claim 1, wherein a field-effect transistor is provided in the first active region.

14. The structure of claim 1, wherein the trench region walls are substantially vertical.

15. The structure of claim 1, wherein the trench region walls are angled from vertical.

16. The structure of claim 1, wherein the gate dielectric is a gate oxide.

17. An isolation structure comprising:
   a substrate having a first active region, a second active region, and a trench region having trench walls provided between the first active region and the second active region, the first active region having a first top corner provided where an upper surface and the trench wall of the trench region adjacent to the first active region meet, the second active region having a second top corner provided where an upper surface and the trench wall of the trench region adjacent to the second active region meet;
   a refill material provided within the trench region and extending to cover a portion of the first top corner and the second top corner;
   a first gate dielectric layer provided on the upper surface of the first active region;
   a second gate dielectric layer provided on the upper surface of the second active region;
   a first gate conductor layer provided on an upper surface of the first gate dielectric layer, wherein the first gate conductor layer is separated from the first top corner by the refill material; and
   a second gate conductor layer provided on an upper surface of the second gate dielectric layer, wherein the second gate conductor is separated from the second top corner by the refill material.

18. The structure of claim 17, wherein the refill material covers the first top corner and the second top corner.

19. The structure of claim 17, wherein the first gate conductor layer and the second gate conductor layer are a polysilicon gate layer, the first polysilicon layer serves as the gate for a first metal-oxide field-effect transistor, and the second polysilicon layer serves as the gate for a second metal-oxide field-effect transistor.

20. The structure of claim 17, wherein the refill material is an oxide.

21. The structure of claim 17, wherein the refill material is a dielectric material.

22. The structure of claim 17, wherein the refill material is an intrinsic semiconductor.

23. The structure of claim 17, wherein the first gate dielectric layer and the second gate dielectric layer are oxide layers.

* * * * *